United States Patent
Ishii et al.

(10) Patent No.: US 8,056,223 B2
(45) Date of Patent: Nov. 15, 2011

(54) METHOD OF PRODUCING A SUSPENSION BOARD WITH CIRCUIT

(75) Inventors: Jun Ishii, Osaka (JP); Hitoki Kanagawa, Osaka (JP); Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/591,978

(22) Filed: Dec. 7, 2009

(65) Prior Publication Data

US 2010/0083492 A1 Apr. 8, 2010

Related U.S. Application Data

(62) Division of application No. 12/457,576, filed on Jun. 16, 2009, now Pat. No. 7,957,614.

(60) Provisional application No. 61/129,667, filed on Jul. 10, 2008.

(30) Foreign Application Priority Data

Jul. 1, 2008 (JP) ................................. 2008-172617

(51) Int. Cl.
H05K 3/30 (2006.01)
(52) U.S. Cl. .............. 29/846; 29/830; 29/464; 174/250; 360/244.9; 385/14
(58) Field of Classification Search ........... 29/846, 29/847; 174/250; 360/244.9; 385/14, 39
See application file for complete search history.

(56) References Cited

U.S. PATENT DOCUMENTS

| | | | |
|---|---|---|---|
| 3,777,154 A | 12/1973 | Lindsey | |
| 3,943,021 A | 3/1976 | Lindsey | |
| 4,413,178 A | 11/1983 | Mourou et al. | |
| 5,994,204 A | 11/1999 | Young et al. | |
| 6,259,373 B1 | 7/2001 | Ghahramani | |
| 6,547,452 B1 | 4/2003 | Chan et al. | |
| 6,704,488 B2 * | 3/2004 | Lavallee et al. | 385/137 |
| 6,712,527 B1 | 3/2004 | Chan et al. | |
| 6,924,437 B1 | 8/2005 | Creekmore et al. | |
| 7,149,376 B2 | 12/2006 | Uchida et al. | |
| 7,404,680 B2 | 7/2008 | Ono et al. | |
| 7,546,003 B2 | 6/2009 | Juni et al. | |
| 2003/0075355 A1 | 4/2003 | Anderson et al. | |
| 2003/0174454 A1 | 9/2003 | Fu et al. | |
| 2004/0042705 A1 | 3/2004 | Uchida et al. | |
| 2004/0165840 A1 | 8/2004 | Kato et al. | |
| 2004/0184737 A1 | 9/2004 | Oono et al. | |
| 2005/0023656 A1 | 2/2005 | Leedy | |
| 2005/0105860 A1 | 5/2005 | Oono et al. | |
| 2005/0176161 A1 | 8/2005 | Bapst et al. | |
| 2005/0265671 A1 | 12/2005 | Ono et al. | |
| 2006/0187564 A1 | 8/2006 | Sato et al. | |
| 2007/0223935 A1 | 9/2007 | Asai et al. | |
| 2008/0115962 A1 * | 5/2008 | Juni et al. | 174/250 |
| 2009/0032299 A1 | 2/2009 | Khan | |

FOREIGN PATENT DOCUMENTS

JP 2006-185548 7/2006

* cited by examiner

*Primary Examiner* — Livius R Cazan
(74) *Attorney, Agent, or Firm* — Jean C. Edwards, Esq.; Edwards Neils PLLC

(57) ABSTRACT

A suspension board with circuit includes a circuit board containing a metal supporting board, an insulating pattern formed on the metal supporting board, and a conductive pattern formed on the insulating pattern; an optical waveguide disposed on the circuit board; and a positioning portion provided on the circuit board in order to position the optical waveguide with respect to the circuit board.

4 Claims, 7 Drawing Sheets

(a)

(b)

(c)

(d)

(e)

METHOD OF PRODUCING A SUSPENSION BOARD WITH CIRCUIT

CROSS-REFERENCE TO RELATED APPLICATIONS

The present application is a Divisional Application of U.S. patent application Ser. No. 12/457,576, filed Jun. 16, 2009, now U.S. Pat. No. 7,957,614 which claims the benefit of U.S. Provisional Application No. 61/129,667, filed on Jul. 10, 2008, and claims priority from Japanese Patent Application No. 2008-172617, filed on Jul. 1, 2008, the contents of which are herein incorporated by reference in their entirety.

BACKGROUND OF THE INVENTION

1. Field of the Invention

The present invention relates to a suspension board with circuit and a producing method thereof. More particularly, the present invention relates to a suspension board with circuit which adopts an optical assist system, and a producing method thereof.

2. Description of Related Art

In recent years, an optical assist system (an optical assist magnetic recording system or a heat assisted recording system) has been known as a magnetic recording system for a hard disk drive or the like.

There has been proposed that, for example, a heat-assisted magnetic recording head including a suspension and an optical waveguide (secondary optical waveguide) provided thereon (cf. for example, Japanese Unexamined Patent Publication No. 2006-185548 (FIG. 9)).

SUMMARY OF THE INVENTION

However, in the heat-assisted magnetic recording head described in Japanese Unexamined Patent Publication No. 2006-185548, when the optical waveguide is disposed on the suspension, it may be difficult to arrange them relatively and accurately.

It is an object of the present invention to provide a suspension board with circuit having an optical waveguide accurately disposed thereon, and a producing method thereof.

The suspension board with circuit of the present invention includes a circuit board including a metal supporting board, an insulating pattern formed on the metal supporting board, and a conductive pattern formed on the insulating pattern; an optical waveguide disposed on the circuit board; and a positioning portion provided on the circuit board in order to position the optical waveguide with respect to the circuit board.

According to the suspension board with circuit, the optical waveguide is positioned with respect to the circuit board by the positioning portion. This positioning can maintain an accurate relative position of the optical waveguide to the circuit board.

In the suspension board with circuit of the present invention, it is preferable that the conductive pattern and the positioning portion are formed from a conductive layer.

In the suspension board with circuit, the positioning portion is formed with the same accuracy as the conductive pattern. Therefore, such positioning portion positions the optical waveguide, thereby allowing the optical waveguide to be disposed with respect to the conductive pattern with high accuracy.

In the suspension board with circuit of the present invention, it is preferable that the insulating pattern and the positioning portion are formed from an insulating layer.

In the suspension board with circuit, the positioning portion is formed with the same accuracy as the insulating pattern. Therefore, such positioning portion positions the optical waveguide, thereby allowing the optical waveguide to be disposed with respect to the insulating pattern with high accuracy.

In the suspension board with circuit of the present invention, it is preferable that the positioning portion is arranged in opposed relation so as to sandwich the optical waveguide and is in contact with each opposite side of the optical waveguide.

In the suspension board with circuit, both opposite sides of the optical waveguide are in contact with the positioning portions which are arranged in opposed relation so as to sandwich the optical waveguide. Therefore, positioning of the optical waveguide in a direction opposed to the positioning portions can be maintained with high accuracy.

In the suspension board with circuit of the present invention, it is preferable that a plurality of the positioning portions are arranged at spaced intervals to each other over a direction in which the optical waveguide extends.

In the suspension board with circuit of the present invention, the plurality of positioning portions position the optical waveguide over the optical waveguide extending direction. Such positioning can dispose the optical waveguide over its extending direction with high accuracy.

The method for producing a suspension board with circuit according to the present invention includes the steps of preparing a circuit board including a metal supporting board, an insulating pattern formed on the metal supporting board, and a conductive pattern formed on the insulating pattern; preparing an optical waveguide; providing the circuit board with a positioning portion for positioning the optical waveguide with respect to the circuit board; and disposing the optical waveguide on the circuit board while positioning the optical waveguide with the positioning portion.

According to the method for producing the suspension board with circuit, the circuit board is prepared and the positioning portion is also provided thereon, and the optical waveguide is prepared. Then, the optical waveguide can be accurately disposed on the circuit board while being positioned with respect thereto by the positioning portion.

According to the method for producing the suspension board with circuit of the present invention, it is preferable that, in the step of preparing the circuit board, the step of forming the conductive pattern on the insulating pattern is conducted simultaneously with the step of providing the positioning portion.

In the method for producing the suspension board with circuit, since the step of forming the conductive pattern is conducted simultaneously with the step of providing the positioning portion, the step of providing the positioning portion is not separately required, so that the number of producing steps can be reduced and the positioning portion can be formed with the same accuracy as the accuracy required for forming the conductive pattern.

According to the method for producing the suspension board with circuit of the present invention, it is preferable that, in the step of preparing the circuit board, the step of forming the insulating pattern on the metal supporting board is conducted simultaneously with the step of providing the positioning portion.

In the method for producing the suspension board with circuit, since the step of forming the insulating pattern is conducted simultaneously with the step of providing the positioning portion, the step of providing the positioning portion is not separately required, so that the number of producing steps can be reduced and the positioning portion can be formed with the same accuracy as the accuracy required for forming the insulating pattern.

DETAILED DESCRIPTION OF THE INVENTION

Figure 1:
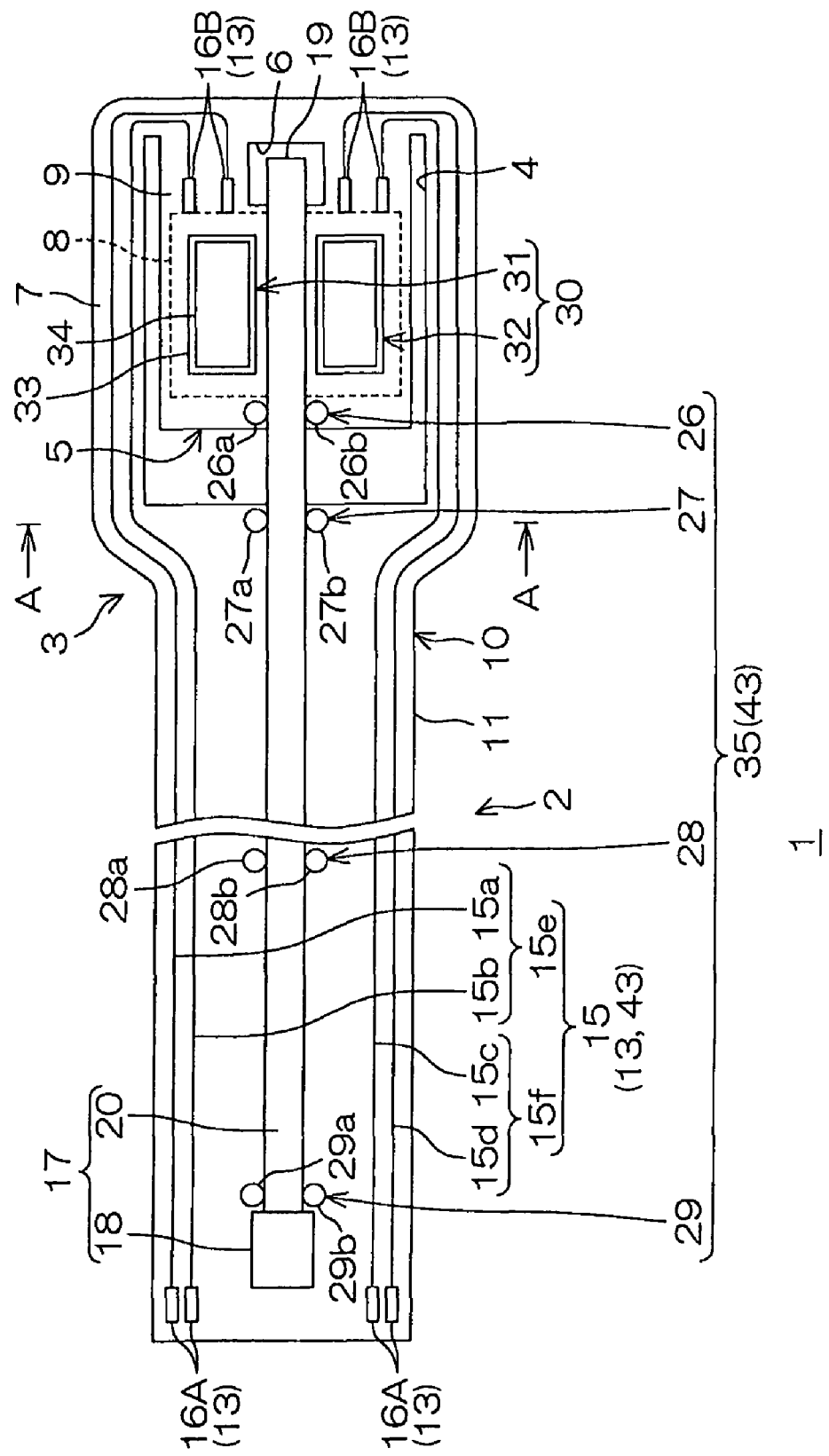
FIG. 1 is a plan view illustrating a suspension board with circuit of an embodiment according to the present invention.
Figure 2:
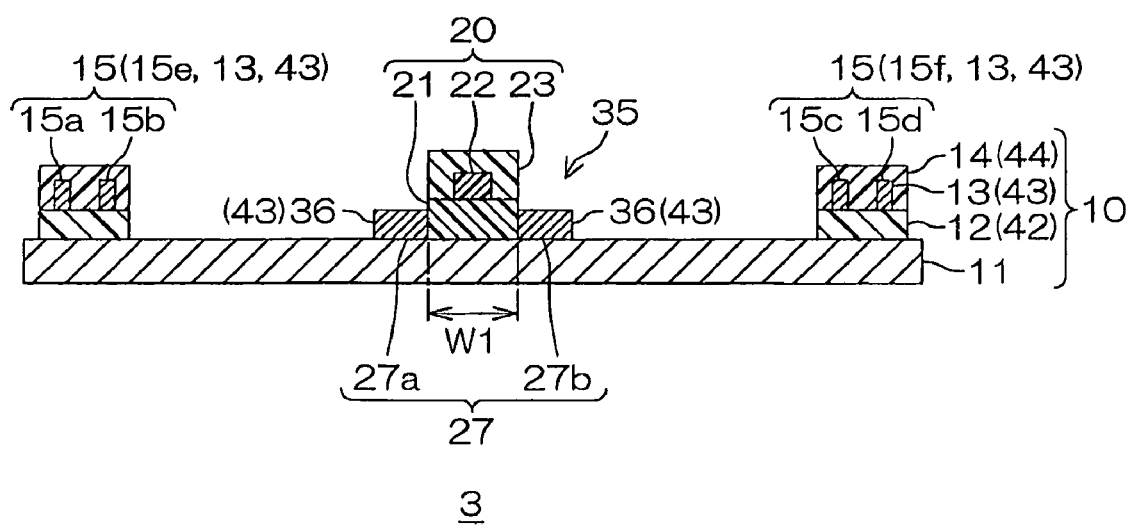
FIG. 2 is a sectional view taken along the line A-A in FIG. 1.
Figure 3:
FIG. 3 is a process diagram for explaining a method for producing the suspension board with circuit, showing a sectional view corresponding to FIG. 2.
Figure 3:
Figure 3:
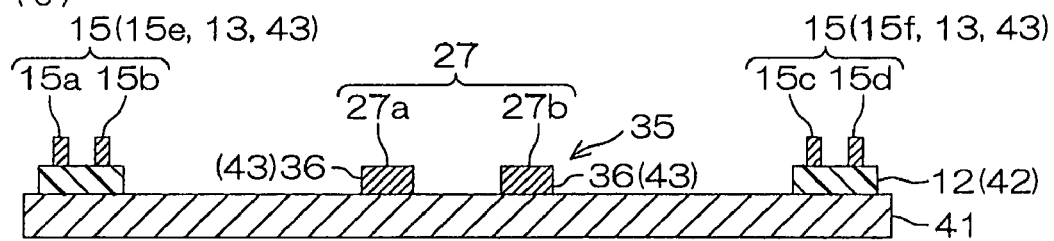
Figure 3:
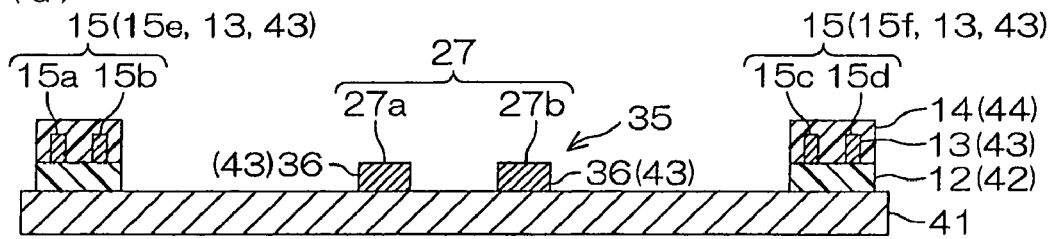
Figure 3:
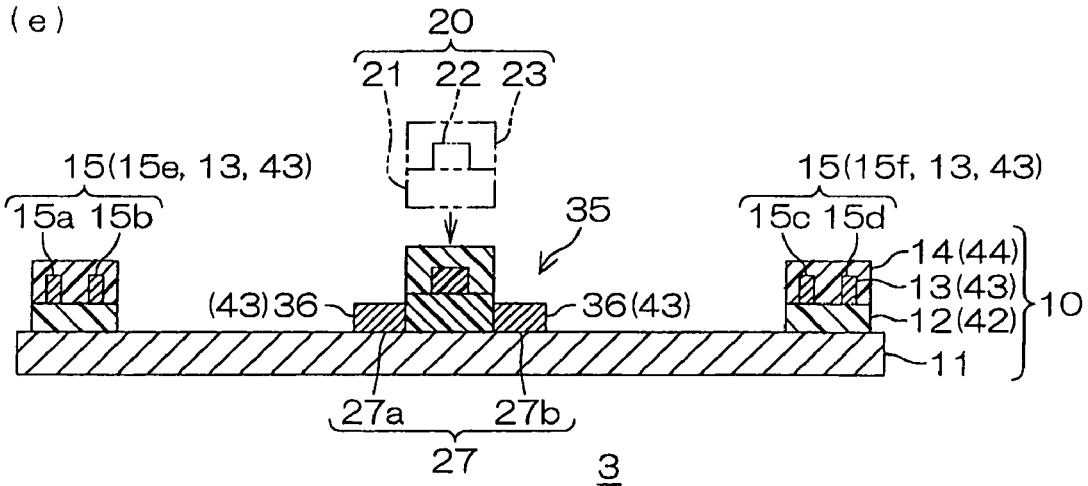

FIG. 1 is a plan view illustrating a suspension board with circuit of an embodiment according to the present invention, FIG. 2 is a sectional view taken along the line A-A in FIG. 1, and FIG. 3 is a process diagram for explaining a method for producing the suspension board with circuit, showing a sectional view corresponding to FIG. 2. To clarify a relative position of a conductive pattern 13, an insulating base pattern 12 and an insulating cover pattern 14 (described later) are omitted in FIG. 1.

In FIG. 1, the suspension board with circuit 1 includes a circuit board 10, a positioning portion 35 provided on the circuit board 10, and an optical assist portion 17 disposed on the circuit board 10.

The circuit board 10 provided with a magnetic head (not shown) in a hard disk drive, and supports the magnetic head while keeping a minute gap between the magnetic head and a hard disk (not shown) against an airflow caused when the magnetic head and the hard disk travel relatively to each other.

The circuit board 10 is formed corresponding to the outer shape of the suspension board with circuit 1, and specifically formed in the shape of a flat belt extending in the lengthwise direction. The circuit board 10 integrally includes a wire portion 2 arranged on the other side in the lengthwise direction (hereinafter referred to as the rear side), and a gimbal 3 arranged on one side of the wire portion 2 in the lengthwise direction (hereinafter referred to as the front side).

The wire portion 2 is formed in a generally rectangular shape in plane view extending in the lengthwise direction.

The gimbal 3 is continuously formed from the front end of the wire portion 2, while having a generally rectangular shape in plane view expanding toward both widthwise outer sides with respect to the wire portion 2. The gimbal 3 is also formed with a slit 4 as an opening having a generally U-shape opening toward the front side in plane view.

Further, the gimbal 3 integrally includes a tongue portion 5 sandwiched by the slit 4 in the widthwise direction, and an outrigger portion 7 arranged on both the widthwise outer sides of the slit 4.

The tongue portion 5 is defined by the slit 4, thereby being formed in a generally rectangular shape in plane view. The tongue portion 5 also includes a mounting portion 8 and a terminal forming portion 9.

The mounting portion 8 is a region for mounting a slider (not shown) with the magnetic head mounted thereon, arranged on the rear-side portion of the tongue portion 5, and formed in a generally rectangular shape in plane view. The mounting portion 8 is also spaced apart from the rear end edge of the tongue portion 5 and is arranged so that a region for forming a first positioning portion 26 described later may be allocated.

The terminal forming portion 9 is a region in which head-side connecting terminal portions 16B described later are formed and arranged on the front side portion with respect to the mounting portion 8. Further, the terminal forming portion 9 has an emitting opening 6 having a generally rectangular shape in plane view.

The emitting opening 6 is formed in a generally rectangular shape in plane view so as to penetrate the circuit board 10 in the thickness direction of the circuit board 10 (hereinafter simply referred to as the thickness direction). Further, the emitting opening portion 6 is formed in the middle of the terminal forming portion 9 in the widthwise direction.

Further, the tongue portion 5 is provided with a pedestal 30.

The pedestal 30 is provided in the mounting portion 8 in order to support the slider (not shown), and includes a first pedestal 31 and a second pedestal 32.

The first pedestal 31 and the second pedestal 32 are arranged in the middle of the mounting portion 8 in the lengthwise direction and is spaced in opposed relation to each other in the widthwise direction. Specifically, the first pedestal 31 is arranged on one side in the widthwise direction of the mounting portion 8, while the second pedestal 32 is arranged on the other side in the widthwise direction of the mounting portion 8 and is spaced in opposed relation to the first pedestal 31 on the other side in the widthwise direction thereof. The first pedestal 31 and the second pedestal 32 each have a generally rectangular shape in plane view extending in the lengthwise direction, both formed in an identical shape in plane view.

The pedestal 30 is formed on the circuit board 10. The pedestal 30 is made of a pedestal base 33 and a conductive pedestal portion 34 formed on the pedestal base 33.

The pedestal base 33 is formed from an insulating base layer 42 described later. The pedestal base 33 is formed on a surface of the metal supporting board 11 in the mounting portion 8, corresponding to the outer shape of the pedestal 30.

The conductive pedestal portion 34 is formed from a conductive layer 43 described later. The conductive pedestal portion 34 is formed on a surface of the pedestal base 33 in a similar shape slightly smaller than the pedestal base 33 in plane view.

The widthwise spacing between the first pedestal 31 and the second pedestal 32 is in the range of, for example, 10 to 250 µm, or preferably 15 to 150 µm.

The positioning portion 35 is provided in order to position an optical waveguide 20 with respect to the circuit board 10, and a plurality thereof are arranged over the lengthwise direction.

That is, the positioning portions 35 are spaced apart from each other in the front-to-rear direction, and specifically, include a first positioning portion 26, a second positioning portion 27, a third positioning portion 28, and a fourth positioning portion 29.

The first positioning portion 26, the second positioning portion 27, the third positioning portion 28, and the fourth positioning portion 29 are sequentially arranged from the front side toward the rear side, and are formed in the generally middle of the circuit board 10 in the widthwise direction.

The first positioning portion 26 is provided partway in the front-to-rear direction of the gimbal 3. Specifically, it is formed at the front end edge of the slit 4 in the circuit board 10 and in the rear end portion of the tongue portion 5. That is, the first positioning portion 26 is formed in the rear-side portion of the mounting portion 8, specifically on the rear side of the pedestal 30 and on the surface of the circuit board 10 at the front end edge of the slit 4.

The first positioning portion 26 is formed from two first protrusions 26a and 26b which are spaced in opposed relation to each other in the widthwise direction. The first protrusions 26a and 26b are formed, each in a generally circular shape in plane view, so as to sandwich the optical waveguide 20 described later in the widthwise direction. Of these two first protrusions 26a and 26b, one first protrusion 26a is arranged on one side in the widthwise direction of the optical waveguide 20, and the other first protrusion 26b is arranged on the other side in the widthwise direction thereof. The first protrusion 26a on one side and the first protrusion 26b on the other side are formed in an identical shape in plane view.

The second positioning portion 27 is provided in the rear end portion of the gimbal 3 and is arranged on the rear side in opposed relation to the first positioning portion 26 so as to sandwich the slit 4 between itself and the first positioning portion 26. That is, the second positioning portion 27 is formed at the rear-side edge of the slit 4 in the circuit board 10, and more specifically, on the surface of the circuit board 10 at the rear end edge of the slit 4. The second positioning portion 27 is formed from two second protrusions 27a and 27b which are spaced in opposed relation to each other in the widthwise direction. The second protrusions 27a and 27b are formed, each in a generally circular shape in plane view, so as to sandwich the optical waveguide 20 in the widthwise direction. Of these two second protrusions 27a and 27b, one second protrusion 27a is arranged on one side in the widthwise direction of the optical waveguide 20, and the other second protrusion 27b is arranged on the other side in the widthwise direction thereof. The second protrusion 27a on one side and the second protrusion 27b on the other side are formed in an identical shape in plane view.

The third positioning portion 28 is provided partway in the front-to-rear direction of the wire portion 2 and is arranged in opposed relation to the rear side of the second positioning portion 27. Further, the third positioning portion 28 is formed on the surface of the circuit board 10 in the wire portion 2. The third positioning portion 28 is formed from two third protrusions 28a and 28b which are spaced in opposed relation to each other in the widthwise direction. The third protrusions 28a and 28b are formed, each in a generally circular shape in plane view, so as to sandwich the optical waveguide 20 in the widthwise direction. Of these two third protrusions 28a and 28b, one third protrusion 28a is arranged on one side in the widthwise direction of the optical waveguide 20, and the other third protrusion 28b is arranged on the other side in the widthwise direction thereof. The third protrusion 28a on one side and the third protrusion 28b on the other side are formed in an identical shape in plane view.

The fourth positioning portion 29 is provided in the rear end portion of the wire portion 2 and is arranged in opposed relation to the rear side of the third positioning portion 28. Specifically, the fourth positioning portion 29 is arranged on the front side of a light emitting device 18 described later in the wire portion 2 and is formed on the surface of the circuit board 10. Further, the fourth positioning portion 29 is formed from two fourth protrusions 29a and 29b which are spaced in opposed relation to each other in the widthwise direction. Such two fourth protrusions 29a and 29b are formed, each in a generally circular shape in plane view, so as to sandwich the optical waveguide 20 in the widthwise direction. Of these two fourth protrusions 29a and 29b, one fourth protrusion 29a is arranged on one side in the widthwise direction of the optical waveguide 20, and the other fourth protrusion 29b is arranged on the other side in the widthwise direction thereof. The fourth protrusion 29a on one side and the fourth protrusion 29b on the other side are formed in an identical shape in plane view.

The first positioning portion 26, the second positioning portion 27, the third positioning portion 28, and the fourth positioning portion 29 are located in the same position in the widthwise direction of the circuit board 10, specifically, in the widthwise center position thereof. When projected along the lengthwise direction of the circuit board 10, these positioning portions are arranged on a straight line. The first positioning portion 26, the second positioning portion 27, the third positioning portion 28, and the fourth positioning portion 29 are made of a conductive positioning portion 36 which is formed from the conductive layer 43, as shown in FIG. 2.

As for the size of the positioning portion 35, each of the protrusions (first protrusions 26a and 26b, second protrusions 27a and 27b, third protrusions 28a and 28b, and fourth protrusions 29a and 29b) has a diameter in the range of, for example, 20 to 500 µm, or preferably 40 to 100 µm. Further, the spacing between two protrusions which are opposed to each other in the widthwise direction (spacing between the first protrusion 26a on one side and the first protrusion 26b on the other side in the widthwise direction, spacing between the second protrusion 27a on one side and the second protrusion 27b on the other side in the widthwise direction, spacing between the third protrusion 28a on one side and the third protrusion 28b on the other side in the widthwise direction, and spacing between the fourth protrusion 29a on one side and the fourth protrusion 29b on the other side in the widthwise direction) W1 is in the range of, for example, 5 to 200 µm, or preferably 10 to 100 µm.

The circuit board 10 includes a metal supporting board 11, an insulating base pattern 12 as an insulating pattern formed on the metal supporting board 11, a conductive pattern 13 formed on the insulating base pattern 12, and an insulating cover pattern 14 formed on the insulating base pattern 12 so as to cover the conductive pattern 13.

The metal supporting board 11 is formed corresponding to the outer shape of the circuit board 10.

The insulating base pattern 12 is formed on the upper surface of the metal supporting board 11 along the conductive pattern 13 so as to correspond to a portion where the conductive pattern 13 in the wire portion 2 and the gimbal 3 is formed. The insulating base pattern 12 is formed from the insulating base layer 42 described later as an insulating layer.

As shown in FIG. 1, the conductive pattern 13 includes external connecting terminal portions 16A, head-side connecting terminal portions 16B, and signal wires 15 for connecting the external connecting terminal portions 16A and the head-side connecting terminal portions 16B, which are formed integrally and continuously. The conductive pattern 13 is also formed from the conductive layer 43.

A plurality (four pieces) of the signal wires 15 are provided along the lengthwise direction of the suspension board with circuit 1, each signal wire 15 arranged in parallel at spaced intervals to each other in the widthwise direction.

The plurality of signal wires 15 are formed with a first wire 15a, a second wire 15b, a third wire 15c, and a fourth wire 15d, and the first wire 15a, the second wire 15b, the third wire 15c, and the fourth wire 15d are sequentially arranged from one side in the widthwise direction toward the other side in the widthwise direction.

More specifically, the first wire 15a, the second wire 15b, the third wire 15c, and the fourth wire 15d are formed so as to extend in parallel to each other. In the gimbal 3, the first wire 15a and the second wire 15b (a first pair of wires 15e) are arranged along the outrigger portion 7 on one side in the widthwise direction, while the third wire 15c and the fourth wire 15d (a second pair of wires 15f) are arranged along the outrigger portion 7 on the other side in the widthwise direction. The first wire 15a, the second wire 15b, the third wire 15c, and the fourth wire 15d (the first pair of wires 15e and the second pair of wires 150 are arranged to reach the front end portion of the outrigger portion 7, then extend inward in the widthwise direction, yet turn back toward the rear side, and finally to reach the terminal forming portion 9. In the wire portion 2, the first pair of wires 15e and the second pair of wires 15f are arranged at a spaced interval to each other in both widthwise end portions of the wire portion 2, respectively.

A plurality (four pieces) of the external connecting terminal portions 16A are provided in the rear-side portion of the wire portion 2, and arranged so as to be each connected with the rear end portion of each of the signal wires 15. Further, the external connecting terminal portions 16A are spaced apart from each other in the widthwise direction. Terminal portions (not shown) of an external circuit board (e.g., a read/write board) are to be connected to the external connecting terminal portions 16A.

The head-side connecting terminal portions 16B are arranged in the gimbal 3, and more specifically, arranged in the terminal forming portion 9 of the tongue portion 5. A plurality (four pieces) of the head-side connecting terminal portions 16B are provided so as to be each connected with the front end portion of each of the signal wires 15. Further, the head-side connecting terminal portions 16B are spaced apart from each other in the widthwise direction. Terminal portions (not shown) of the magnetic head are to be connected to the head-side connecting terminal portions 16B.

The insulating cover pattern 14 is located over the wire portion 2 and the gimbal 3, and is arranged on the upper surface of the insulating base pattern 12 so as to correspond to a portion where the signal wires 15 are formed, as shown in FIG. 2. Further, the insulating cover pattern 14 is formed so as to expose the external connecting terminal portions 16A and the head-side connecting terminal portions 16B, and to cover the signal wires 15. The insulating cover pattern 14 is formed from an insulating cover layer 44.

As shown in FIG. 1, the optical assist portion 17 is provided in order to use the suspension board with circuit 1 in an optical assist system, and includes an optical waveguide 20 and a light emitting device 18.

The optical waveguide 20 is disposed on the circuit board 10, and is arranged over the wire portion 2 and the gimbal 3 at spaced intervals to the signal wires 15. Specifically, the optical waveguide 20 is formed in a linear shape in plane view along the lengthwise direction and is arranged in the widthwise center position of the circuit board 10. Further, the optical waveguide 20 is arranged between the first pair of wires 15e and the second pair of wires 15f so as to extend in parallel to these pairs.

The optical waveguide 20 is arranged so as to orthogonally traverse the slit 4 from the front end portion of the wire portion 2, to pass through between the first pedestal 31 and the second pedestal 32, and then to let the front end face 19 of the optical waveguide 20 face the emitting opening 6.

The optical waveguide 20 is sandwiched by the positioning portion 35 in the widthwise direction. That is, both the outer-side surfaces of the optical waveguide 20 in the widthwise direction are in contact with the inner-side surfaces of the positioning portion 35 in the widthwise direction. Specifically, widthwise one side surface of the optical waveguide 20 is in contact with the widthwise other side surfaces (the other end-most surface in the widthwise direction) of the first protrusion 26a, the second protrusion 27a, the third protrusion 28a, and the fourth protrusion 29a on one side, while the widthwise other side surface of the optical waveguide 20 is in contact with widthwise one side surfaces (one end-most edge in the widthwise direction) of the first protrusion 26b, the second protrusion 27b, the third protrusion 28b, and the fourth protrusion 29b on the other side, and the optical waveguide 20 is fitted between them.

Therefore, the optical waveguide 20 is positioned by the positioning portion 35.

The optical waveguide 20 is optically connected to the light emitting device 18. That is, the optical waveguide 20 is formed with its rear end connected to the light emitting device 18 and its front end facing the emitting opening 6.

The width of the optical waveguide 20 is equal to the spacing W1 between two protrusions of the positioning portion 35 in opposed relation to each other in the width direction.

The light emitting device 18 is a light source for allowing light to enter the optical waveguide 20, and for example, converts electric energy into light energy to emit high-energy light. This light emitting device 18 is located on the rear end side of the circuit board 10. more specifically, on the rear end side of the wire portion 2, and is arranged between the first pair of wires 15e and the second pair of wires 15f at spaced intervals thereto.

In the optical assist portion 17, the electric energy supplied from the external circuit board (not shown) is converted into light energy in the light emitting device 18, and the resulting light is emitted to the optical waveguide 20. The light thus emitted passes the optical waveguide 20 and is reflected on the front end face 19 (the end face of the front end portion) of the optical waveguide, and the reflected light is applied to a hard disk (not shown).

As shown in FIG. 2, the optical waveguide 20 includes an under clad layer 21, a core layer 22 formed on the under clad layer 21, and an over clad layer 23 formed on the under clad layer 21 so as to cover the core layer 22.

The over clad layer 23 is formed so that both widthwise outer end edges thereof are in the same positions in plane view as those of the under clad layer 21.

Next, a method for producing the suspension board with circuit 1 is described with reference to FIG. 3.

In this method, a circuit board 10 is first prepared, as shown in FIGS. 3(a) to 3(d).

To prepare the circuit board 10, as shown in FIG. 3(a), a metal supporting layer 41 is first prepared.

The metal supporting layer 41 has a sheet shape and is formed into a metal supporting board 11 by trimming in the subsequent step, and as a metal material for forming the metal supporting layer 41, for example, stainless steel or 42-alloy is used. Preferably, stainless steel is used. The metal supporting layer 41 has a thickness in the range of, for example, 10 to 30 μm, or preferably 15 to 25 μm.

Then, as shown in FIG. 3(b), an insulating base layer 42 having an insulating base pattern 12 and a pedestal base 33 (cf. FIG. 1) is formed.

As an insulating material for forming the insulating base layer 42, for example, synthetic resin such as polyimide, polyether nitrile, polyether sulfone, polyethylene terephthalate, polyethylene naphthalate, and polyvinyl chloride is used. Among them, a photosensitive synthetic resin is preferably used, or photosensitive polyimide is more preferably used.

To form the insulating base layer 42, for example, a photosensitive synthetic resin is applied to a surface of the metal supporting layer 41 and then dried. Thereafter, the dried resin is exposed and developed in a pattern in which the insulating base pattern 12 and the pedestal base 33 are formed, and is then cured as required.

As an alternative, the insulating base layer 42 can be formed in the following manner. A solution of the above-mentioned synthetic resin is uniformly applied to a surface of the metal supporting layer 41 and then dried. Subsequently, the dried resin is heated to be cured as required. Thereafter, the cured resin is formed in the above-mentioned pattern by etching or other processing method.

As another alternative, the insulating base layer 42 can be formed, for example, by preliminarily forming a synthetic resin into a film having the above-mentioned pattern, and adhesively bonding the film to a surface of the metal supporting layer 41 via a known adhesive layer.

The insulating base layer 42 thus formed has a thickness in the range of, for example, 1 to 20 μm, or preferably 8 to 15 μm.

Therefore, the insulating base pattern 12 and the pedestal base 33 can be formed simultaneously.

Then, as shown in FIG. 3(c), a conductive layer 43 having a conductive pattern 13, a conductive pedestal portion 34 (cf. FIG. 1), and a conductive positioning portion 36 is formed.

As a conductive material for forming the conductive layer 43, for example, copper, nickel, gold, tin, solder, and alloys thereof is/are used. Among them, copper is preferably used.

To form the conductive layer 43, a known patterning method, such as an additive method or a subtractive method is used, or preferably the additive method is used.

In the additive method, specifically, a conductive seed layer is first formed on the surface of the metal supporting layer 41 including the insulating base layer 42 by a spattering process or the like. Then, a plating resist is formed on the surface of the conductive seed layer in a pattern reverse to the conductive pattern 13, the conductive pedestal portion 34, and the conductive positioning portion 36. Subsequently, the conductive layer 43 is formed on the surface of the conductive seed layer on the insulating base layer 42 exposed from the plating resist by electrolytic plating. Thereafter, the plating resist and the conductive seed layer on which the plating resist is laminated are removed.

The conductive layer 43 thus formed has a thickness in the range of, for example, 3 to 50 μm, or preferably 5 to 25 μm.

Therefore, the conductive pattern 13, the conductive pedestal portion 34, and the conductive positioning portion 36 (positioning portion 35) can be formed simultaneously.

As a result of this, the positioning portion 35 formed from the conductive layer 43 can be formed.

Then, as shown in FIG. 3(d), an insulating cover pattern 14 is formed on the insulating base pattern 12 in the above-mentioned pattern. The insulating cover pattern 14 is made of an insulating cover layer 44, and an insulating material for forming the insulating cover layer 44 includes the same material as that for the insulating base layer 42.

To form the insulating cover layer 44, for example, a photosensitive synthetic resin is applied to a surface of the insulating base layer 42 including the conductive layer 43 (except the conductive positioning portion 36) and then dried. Thereafter, the dried resin is exposed and developed in the above-mentioned pattern, and is then cured as required.

As an alternative, the insulating cover layer 44 can be formed in the following manner. A solution of the above-mentioned synthetic resin is uniformly applied to a surface of the insulating base layer 42 including the conductive layer 43 (except the conductive positioning portion 36) and then dried. Subsequently, the dried resin is heated to be cured as required. Thereafter, the cured resin is formed in the above-mentioned pattern by etching or other processing method.

As another alternative, the insulating cover layer 44 can be formed, for example, by preliminarily forming a synthetic resin into a film having the above-mentioned pattern, and adhesively bonding the film to a surface of the insulating base layer 42 including the conductive layer 43 (except the conductive positioning portion 36) via a known adhesive layer.

The insulating cover layer 44 thus formed has a thickness in the range of, for example, 2 to 25 μm, or preferably 3 to 10 μm.

Figure 8:
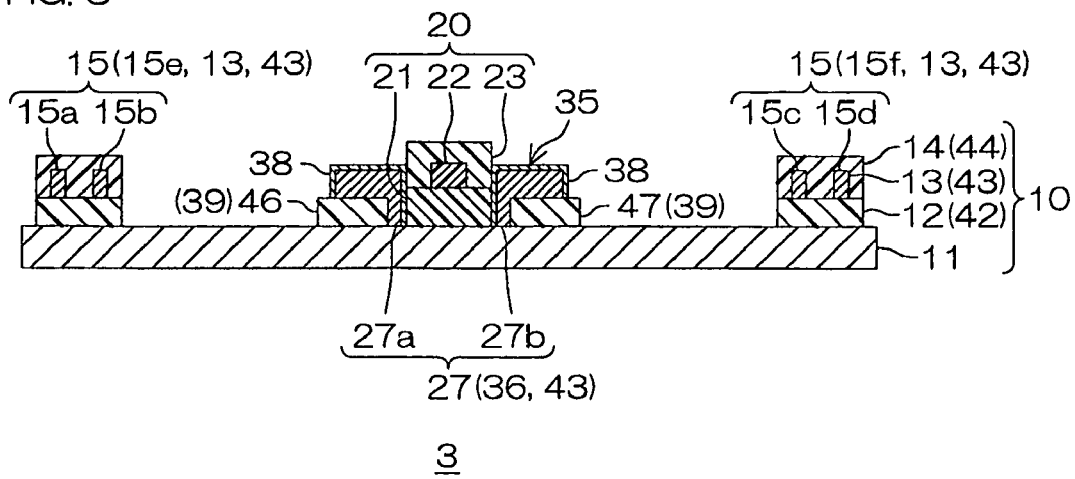
FIG. 8 is a sectional view of a suspension board with circuit of another embodiment (embodiment in which the widthwise other side surface of the first substrate base is covered with a protrusion on one side, and widthwise one side surface of the second substrate base is covered with a protrusion on the other side) according to the present invention.
Figure 9:
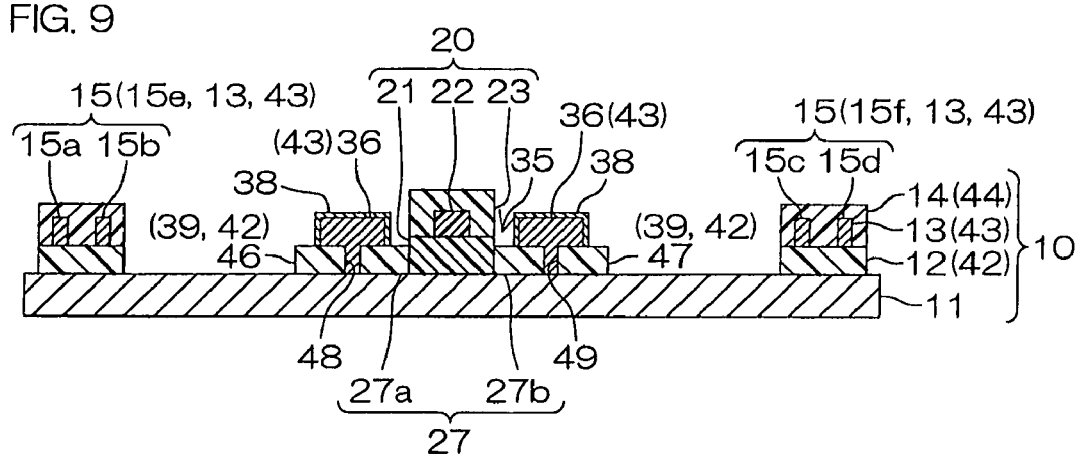
FIG. 9 is a sectional view of a suspension board with circuit of another embodiment (embodiment in which a first base opening and a second base opening are formed in a first substrate base and a second substrate base, respectively) according to the present invention.

Subsequently, as shown in FIGS. 8 and 9, a metal plating layer 38 is formed as required on the surfaces of head-side connecting terminal portions 16B and external connecting terminal portions 16A, the conductive pedestal portion 34, and the conductive positioning portion 36. The metal plating layer 38 is formed, for example, from gold or nickel by electrolytic plating or electroless plating. The metal plating layer 38 has a thickness in the range of, for example, 0.5 to 5 μm, or preferably 0.5 to 3 μm.

Then, in this method, as shown in FIG. 1, a slit 4 and an emitting opening 6 are formed, and the metal supporting board 11 is also formed by trimming the metal supporting layer 41.

As a method for forming the slit 4 and the emitting opening 6 and a method for trimming the metal supporting layer 41, for example, electric discharge, use of laser, mechanical punching, etching, or the like is used. Among them, etching (wet etching) is preferably used. In wet etching, an acidic aqueous solution such as an aqueous ferric chloride solution is used as an etchant.

Thus, the circuit board 10 including the metal supporting board 11, the insulating base pattern 12, the conductive pattern 13, and the insulating cover pattern 14, and provided with the positioning portion 35 can be prepared. This allows the wire portion 2 and the gimbal 3 to be simultaneously formed.

In this method, an optical waveguide 20 is prepared as shown, in phantom line of FIG. 3(e).

To prepare the optical waveguide 20, an under clad layer 21, a core layer 22, and an over clad layer 23 are sequentially laminated on a release sheet such as a polyethylene terephthalate (PET) sheet which is not shown. Subsequently, the optical waveguide 20 is removed from the release sheet.

To sequentially laminate the under clad layer 21, the core layer 22, and the over clad layer 23, the under clad layer 21 is first formed on a release sheet.

As a material for forming the under clad layer 21, for example, polyimide resin, polyamide resin, silicone resin, epoxy resin (alicyclic epoxy resin, etc.), acrylic resin, or fluorene derivative resin, a mixed resin of fluorene derivative resin and alicyclic epoxy resin, and a mixed resin of any of these resins and an alicyclic ether compound (e.g., an oxetane compound, etc.) is used. These resins are preferably used in the form of photosensitive resins containing a photosensitizer. Preferably, a mixed resin of a photosensitive fluorene derivative resin (a photosensitive fluorene epoxy resin as raw material) and an alicyclic epoxy resin is used. The photosensitizer that may be used includes, for example, a known onium salt, and more specifically, 4,4-bis[di(β-hydroxyethoxy)phenylsulfinio]phenylsulfid-bis-hexafluoroantimonate, or the like.

To form the under clad layer 21, for example, a varnish (resin solution) of any of the above-mentioned resins is prepared using a known diluent, and the varnish thus prepared is applied to the surface of the release sheet. Thereafter, the applied varnish is dried, and is then cured as required. In the case of using a varnish of a photosensitive resin, after application and drying of the varnish, the dried varnish is exposed to light via a photomask, and is then developed by dissolving an unexposed portion with a known organic solvent or the like. Thereafter, the developed varnish is cured as required.

The under clad layer 21 thus formed has a refractive index in the range of, for example, 1.45 to 1.55. Further, the under clad layer 21 has a thickness in the range of, for example, 1 to 50 μm, or preferably 5 to 10 μm, and has a width in the range of, for example, 5 to 200 μm, or preferably 10 to 100 μm.

Subsequently, the core layer 22 is formed on the under clad layer 21.

As a material for forming the core layer 22, a resin material having a higher refractive index than that for the under clad layer 21 is used. The resin material that may be used includes, for example, the same resin as those mentioned above. Preferably, a mixed resin of a photosensitive fluorene derivative resin (a photosensitive fluorene epoxy resin as raw material) and an oxetane compound is used.

To form the core layer 22, for example, a varnish (resin solution) of any of the above-mentioned resins is prepared using a known diluent, the varnish thus prepared is applied to the surface of the release sheet including the under clad layer 21. Thereafter, the applied varnish is dried, and is then cured as required. In the case of using a varnish of a photosensitive resin, after application and drying of the varnish, the dried varnish is exposed to light via a photomask, and is then developed by dissolving an unexposed portion with a known organic solvent or the like. Thereafter, the developed varnish is cured as required.

The refractive index of the core layer 22 thus formed is set higher than that of the under clad layer 21, and is in the range of, for example, 1.55 to 1.65. Further, the core layer 22 has a thickness in the range of, for example, 1 to 30 μm, or preferably 2 to 10 μm, and has a width in the range of, for example, 1 to 30 μm, or preferably 2 to 20 μm.

Subsequently, the over clad layer 23 is formed on the under clad layer 21 so as to cover the core layer 22.

As a material for forming the over clad layer 23, the same resin material as that for the under clad layer 21 described above is used.

To form the over clad layer 23, for example, a varnish (resin solution) of any of the above-mentioned resins is prepared using a known diluent, the varnish thus prepared is applied to the surface of the release sheet including the core layer 22 and the under clad layer 21. Thereafter, the applied varnish is dried, and is then cured as required. In the case of using a varnish of a photosensitive resin, after application and drying of the varnish, the dried varnish is exposed to light via a photomask, and is then developed by dissolving an unexposed portion with a known organic solvent or the like. Thereafter, the developed varnish is cured as required.

The refractive index of the over clad layer 23 thus formed is set lower than that of the core layer 22, and is set to, for example, the same refractive index as that of the under clad layer 21. Further, the over clad layer 23 has a thickness from the surface of the core layer 23 in the range of, for example, 1 to 50 μm, or preferably 5 to 10 μm, and has a width in the range of, for example, 5 to 200 μm, or preferably 10 to 100 μm.

Thus, the under clad layer 21, the core layer 22, and the over clad layer 23 are sequentially laminated on the release sheet, whereby the optical waveguide 20 including these layers can be prepared.

The optical waveguide 20 has a thickness in the range of, for example, 3 to 50 μm, or preferably 12 to 18 μm.

To dispose the optical waveguide 20, the positioning portion 35 is used to position the optical waveguide 20 with respect to the circuit board 10.

Specifically, as indicated by the arrow in FIG. 3(e), the optical waveguide 20 is inserted between each of the pairs of protrusions in the positioning portion 35 so that both the outer-side surfaces of the under clad layer 21 of the optical waveguide 20 in the widthwise direction are in contact with the inner-side surfaces of the positioning portion 35 (conductive positioning portions 36) in the widthwise direction.

When the optical waveguide 20 is disposed, it is located on the upper surface of the circuit board 10 via an adhesive layer as required.

Then, in the rear-side portion of the wire portion 2, a light emitting device 18 is disposed on the circuit board 10 so as to be optically connected with the rear end of the optical waveguide 20, as shown in FIG. 1. When the light emitting device 18 is disposed, it is located on the upper surface of the circuit board 10 via an adhesive layer as required.

Thus, the suspension board with circuit 1 is obtained.

Next, an outline of the suspension board with circuit 1 thus obtained on which a slider with a magnetic head mounted thereon is mounted before mounted on a hard disk drive will be explained.

First, a slider with a magnetic head mounted thereon is mounted on the mounting portion 8. The mounting of the slider allows terminal portions (not shown) of the magnetic head to be electrically connected to the head-side connecting terminal portions 16B.

In the mounting of the slider, the head-side connecting terminal portions 16B and the terminal portions of the magnetic head are electrically connected to one another. Along with the connection of the head-side connecting terminal portions 16B, the external connecting terminal portions 16A (cf. FIG. 1) and terminal portions (not shown) of a read/write board are electrically connected to one another.

Next, this suspension board with circuit 1 is mounted on a hard disk drive. In the mounting of the hard disk drive, the magnetic head is opposed through a minute gap to a hard disk (not shown) which rotates relatively to the magnetic head. Thus, the magnetic head is maintained at a predetermined angle with respect to the hard disk (not shown).

As a result of this, the hard disk drive equipped with the magnetic head, the slider, the suspension board with circuit 1, and the external circuit board can adopt the optical assist system.

In the suspension board with circuit 1, the optical waveguide 20 is positioned with respect to the circuit board 10 using the positioning portion 35. This positioning can maintain an accurate relative position of the optical waveguide 20 to the circuit board 10.

In the method for producing the suspension board with circuit 1, the circuit board 10 is prepared and also provided with the positioning portion 35. Further, the optical waveguide 20 is prepared separately. The optical waveguide 20 can be disposed while being positioned by the positioning portion 35 of the circuit board 10, thereby enabling the optical waveguide 20 to be accurately disposed on the circuit board 10.

Further, in the method for producing the suspension board with circuit 1, the step of forming the conductive pattern 13 is conducted simultaneously with the step of providing the positioning portion 35.

Therefore, the step of providing the positioning portion 35 is not separately required, so that the number of producing steps can be reduced and the positioning portion 35 can be formed with the same accuracy as the accuracy required for forming the conductive pattern 13, that is, high accuracy based on a patterning method such as an additive method or the like. As a result, the optical waveguide 20 can be disposed with high accuracy.

Since both the outer-side surfaces of the optical waveguide 20 in the widthwise direction are in contact with the inner-side surfaces in the widthwise direction of two protrusions of the positioning portion 35, which are arranged in opposed relation to each other so as to sandwich the optical waveguide 20, the optical waveguide 20 can be positioned in the widthwise direction with high accuracy.

In the above description, the positioning portion 35 is formed including four positioning portions (first positioning portion 26, second positioning portion 27, third positioning portion 28, and fourth positioning portion 29). However, the number thereof is not particularly limited, and for example, at least two (specifically, two of the first positioning portion 26 and the fourth positioning portion 29) or more positioning portions may be formed, and specifically, three, or five or more positioning portions are formed.

Preferably, a plurality (two or more) of positioning portions are formed in the front-to-rear direction of the circuit board 10. This allows the positioning portion 35 to reliably position the optical waveguide 20 in the front-to-rear direction. Therefore, the optical waveguide 20 can be positively disposed on a straight line over the front-to-rear direction.

Further, each of the four positioning portions (first positioning portion 26, second positioning portion 27, third positioning portion 28, and fourth positioning portion 29) is formed from two protrusions (two first protrusions 26a and 26b, two second protrusions 27a and 27b, two third protrusions 28a and 28b, and two fourth protrusions 29a and 29b). However, for example, although not shown, each of the four positioning portions can be formed from only one protrusion, and with these protrusions, the optical waveguide can also be sandwiched in the width direction.

In this case, the first positioning portion 26, the second positioning portion 27, the third positioning portion 28, and the fourth positioning portion 29 are formed (in a zigzag pattern) along the front-to-rear direction so as to sandwich both widthwise sides of the optical waveguide 20 alternately (in a staggered manner). Particularly, the first positioning portion 26 and the third positioning portion 28 are formed from the first protrusion 26a on one side and the third protrusion 28a on one side, respectively, while the second positioning portion 27 and the fourth positioning portion 29 are formed from the second protrusion 27a on the other side and the fourth protrusion 29a on the other side, respectively. Alternatively, the protrusion in each of the positioning portions can also be formed in the order reverse (reverse in the width direction) to the above.

Preferably, as shown in FIG. 1, the positioning portion 35 is formed from a plurality of positioning portions (first positioning portion 26, second positioning portion 27, third positioning portion 28, and fourth positioning portion 29) each having two protrusions (each of the protrusions on one side and each of the protrusions on the other side) in the widthwise direction.

Thus, positioning of the optical waveguide 20 in the widthwise direction can be reliably ensured with high accuracy.

In the above description, the positioning portion 35 is formed in a generally circular shape in plane view. However, the shape thereof is not particularly limited, and the positioning portion 35 can also be formed in a proper shape, for example, a generally polygonal shape in plane view such as a rectangular shape in plane view (a square shape, a rectangular shape longer in the front-to-rear direction, etc.). When the positioning portion 35 is formed in a rectangular shape in plane view, the maximum length thereof is set in the range of, for example, 20 to 10000 μm, or preferably 40 to 1000 μm.

Figure 4:
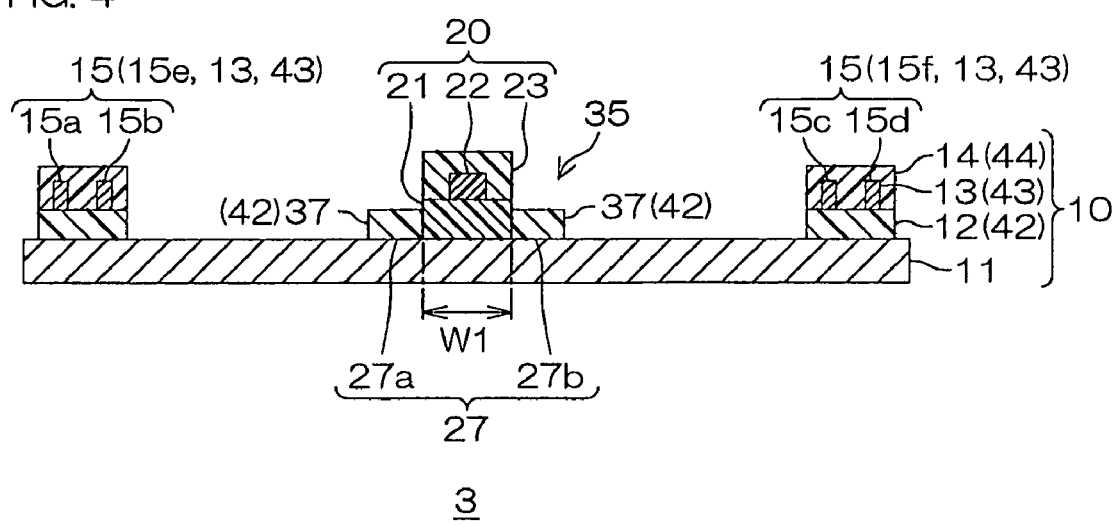
FIG. 4 is a sectional view of a suspension board with circuit of another embodiment (embodiment in which a positioning portion is formed from an insulating base layer) according to the present invention.
Figure 5:
FIG. 5 is a process diagram for explaining a method for producing the suspension board with circuit, showing a sectional view corresponding to FIG. 4.
Figure 5:
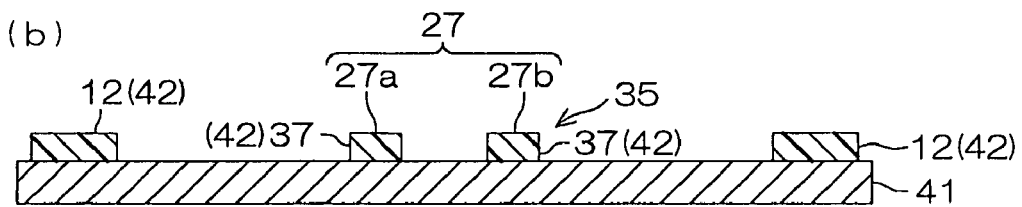
Figure 5:
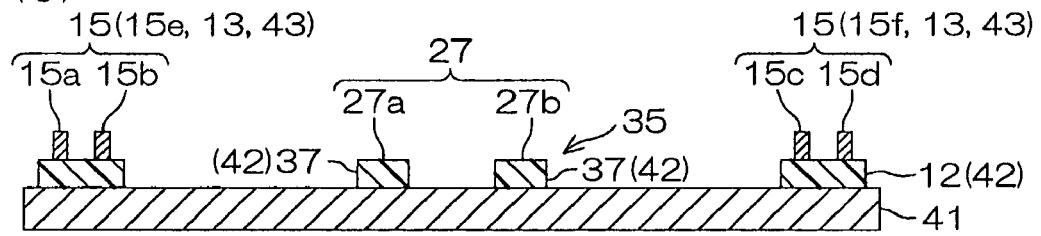
Figure 5:
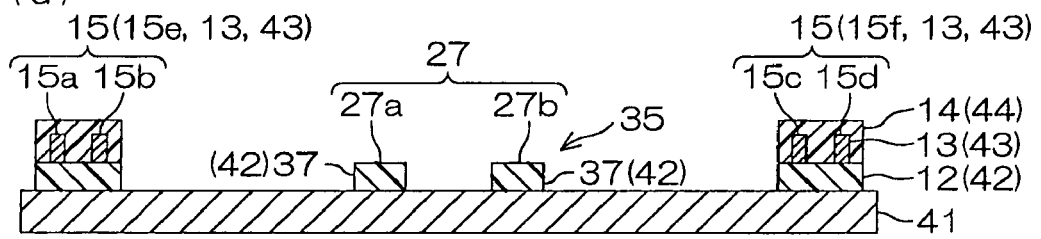
Figure 5:
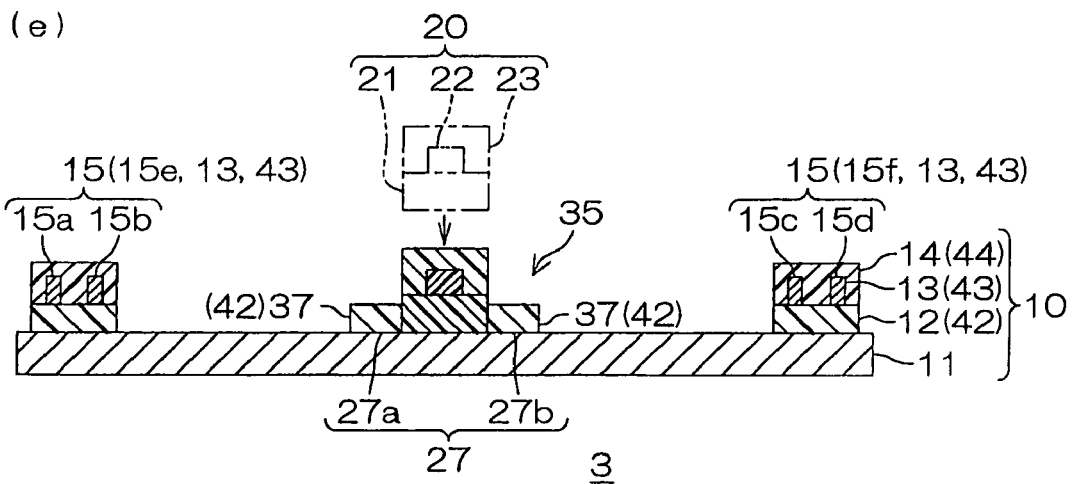

FIG. 4 is a sectional view of a suspension board with circuit of another embodiment according to the present invention and FIG. 5 is a process diagram for explaining a method for producing the suspension board with circuit, showing a sectional view corresponding to FIG. 4. The same reference numerals are used in each of the subsequent figures for the same members as those above, and the description thereof is omitted.

In the above description, the positioning portion 35 is formed from the conductive layer 43. However, for example, as shown in FIG. 4, the positioning portion 35 can be formed from the insulating base layer 42.

The positioning portion 35 is formed from a positioning base 37 which is formed from the insulating base layer 42. Specifically, the positioning base 37 is directly formed on the upper surface of the metal supporting board 11, and is provided in the same shape and the same position as the conductive positioning portion 36 shown in FIG. 2.

In the step of preparing the circuit board 10, the positioning base 37 is formed by simultaneously conducting the step of forming the insulating base pattern 12.

In other words, in the formation of the circuit board 10, as shown in FIG. 5(a), the metal supporting layer 41 is first prepared, and then, as shown in FIG. 5(b), the insulating base layer 42 having the insulating base pattern 12, the positioning base 37, and the pedestal base 33 (cf. FIG. 1) is formed. This simultaneously forms the insulating base pattern 12, the positioning base 37, and the pedestal base 33.

Subsequently, as shown in FIG. 5(c), the conductive layer 43 having the conductive pattern 13 and the conductive pedestal portion 34 (cf. FIG. 1) is formed, and thereafter, as shown in FIG. 5(d), the insulating cover pattern 14 is formed on the insulating base pattern 12.

In the method for producing the suspension board with circuit 1, the step of forming the insulating base pattern 12 is conducted simultaneously with the step of providing the positioning base 37 of the positioning portion 35.

Therefore, the step of providing the positioning portion 35 is not separately required, so that the number of producing steps can be reduced and the positioning portion 35 can be formed with the same accuracy as the accuracy required for forming the insulating base pattern 12 (e.g., accuracy based on photographic processing using a photosensitive polyimide, etc.). As a result, the optical waveguide 20 can be disposed with high accuracy.

FIGS. 6 to 9 each show a sectional view of a suspension board with circuit of another embodiment according to the present invention.

In the above-mentioned description of FIG. 2, the conductive positioning portion 36 of the positioning portion 35 is directly formed on the metal supporting board 11. However, for example, as shown in FIG. 6, the conductive positioning portion 36 can also be formed on the metal supporting board 11 via a substrate base 39.

The substrate base 39 is interposed between the conductive positioning portion 36 and the metal supporting board 11. That is, the substrate base 39 is formed on the upper surface of the metal supporting board 11 in a pattern corresponding to a portion where the optical waveguide 20 is disposed and corresponding to a portion where the conductive positioning portion 36 is formed. In other words, the substrate base 39 is formed so as to extend in the front-to-rear direction and to include the conductive positioning portion 36 in plane view. Further, the substrate base 39 is formed from the insulating base layer 42.

The substrate base 39 has a width in the range of, for example, 100 to 2000 μm, or preferably 150 to 1000 μm.

Figure 6:
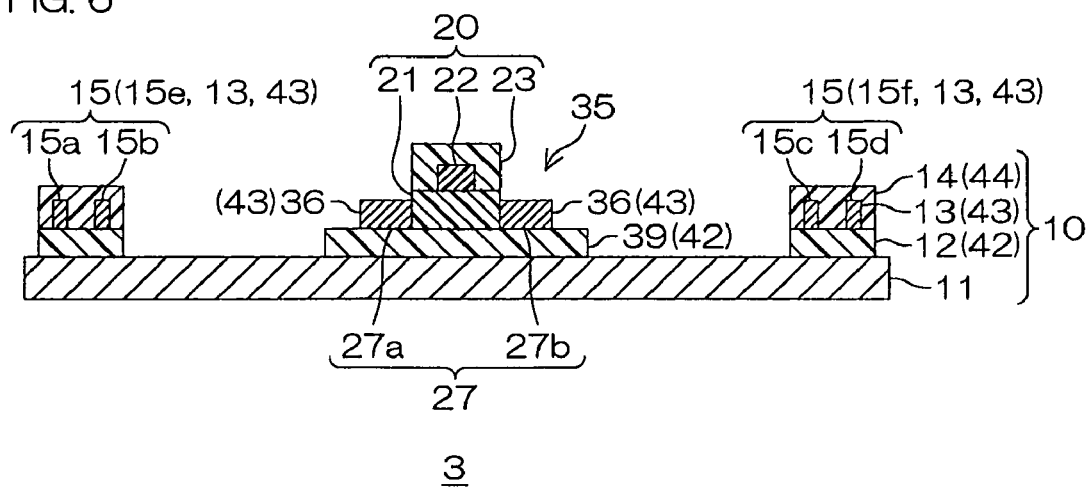
FIG. 6 is a sectional view of a suspension board with circuit of another embodiment (embodiment in which a substrate base is interposed between a conductive positioning portion and a metal supporting board) according to the present invention.

To form the suspension board with circuit 1, the metal supporting layer 41 is first prepared (cf. FIG. 3(a)), and then, the insulating base layer 42 having the insulating base pattern 12, the pedestal base 33, and the substrate base 39 is formed (cf. FIGS. 3(b) and 6). Subsequently, the conductive layer 43 having the conductive pattern 13, the conductive pedestal portion 34, and the conductive positioning portion 36 is formed (cf. FIG. 3(c)), and the insulating cover layer 44 made of the insulating cover pattern 14 is then formed.

In the suspension board with circuit 1 thus obtained, since the substrate base 39 is interposed between the conductive positioning portion 36 and the metal supporting board 11, the positioning portion 35 can be formed with high accuracy while achieving improvement in adhesion to the metal supporting board 11.

In the above-mentioned description of FIG. 6, the substrate base 39 is continuously formed in the widthwise direction. However, for example, as shown in FIG. 7, a base opening 40 can also be formed in the substrate base 39.

Figure 7:
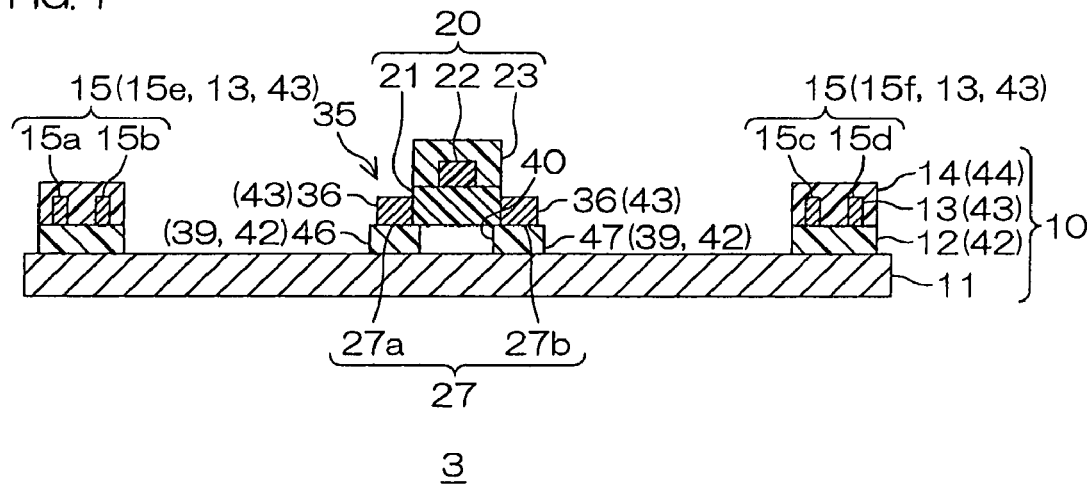
FIG. 7 is a sectional view of a suspension board with circuit of another embodiment (embodiment in which a base opening is formed in a substrate base) according to the present invention.

In FIG. 7, the base opening 40 is formed partway (at a generally center) in the substrate base 39 in the widthwise direction so as to penetrate the substrate base 39 in the thickness direction, and is opposed in the thickness direction to a portion (a portion other than both widthwise end portions) of the optical waveguide 20 partway in the widthwise direction.

As a result of the formation of the base opening 40, the substrate base 39 includes a first substrate base 46 and a second substrate base 47.

The first substrate base 46 is arranged on one side in the widthwise direction and is formed corresponding to each of the protrusions on one side (protrusions 26a, 27a, 28a, and 29a on one side). Both the widthwise end portions of the upper surface of the first substrate base 46 and both the widthwise side surfaces thereof are exposed from each of the protrusions on one side. The optical waveguide 20 is laminated on the widthwise other end portion of the upper surface of the first substrate base 46.

The second substrate base 47 is arranged on the other side in the widthwise direction at a spaced interval to the first substrate base 46, and is formed corresponding to each of the protrusions on the other side (protrusions 26b, 27b, 28b, and 29b on the other side). Both the widthwise end portions of the upper surface of the second substrate base 47 and both the widthwise side surfaces thereof are exposed from each of the protrusions on the other side. The optical waveguide 20 is laminated on widthwise one end portion of the upper surface of the second substrate base 47.

The width of the base opening 40 is slightly smaller than that of the optical waveguide 20, and is, for example, 180 μm or less, or preferably 160 μm or less, and usually 3 μm or more.

A gap (base opening 40) is formed in the thickness direction between the optical waveguide 20 disposed on the circuit board 10 and the metal supporting board 11.

In the above-mentioned description of FIG. 7, although each of the widthwise inner-side surfaces of the first substrate base 46 and the second substrate base 47 is exposed from the positioning portion 35, for example, each of them can also be covered with the positioning portion 35, as shown in FIG. 8.

In FIG. 8, a portion partway along the widthwise direction and the widthwise other end portion of the upper surface of the first substrate base 46, and the widthwise other side surface of the first substrate base 46 are covered with the protrusions on one side (protrusions 26a, 27a, 28a, and 29a on one side).

A portion partway along the widthwise direction and widthwise one end portion of the upper surface of the second substrate base 47, and widthwise one side surface of the second substrate base 47 are covered with the protrusions on the other side (protrusions 26b, 27b, 28b, and 29b on the other side).

The optical waveguide 20 disposed on the circuit board 10 is directly laminated on the upper surface of the metal supporting board 11.

The metal plating layer 38 formed on the surface (widthwise inner-side surface) of the conductive positioning portion 36 comes in contact with both the widthwise outer-side surfaces of the optical waveguide 20.

In the above-mentioned description, each of the first substrate base 46 and the second substrate base 47 is continuously formed in the widthwise direction. However, for example, as shown in FIG. 9, the first base opening 48 and the second base opening 49 can also be formed in the first substrate base 46 and the second substrate base 47, respectively.

In FIG. 9, the first base opening 48 is formed partway (at the generally center) in the first substrate base 46 in the widthwise direction so as to penetrate the first substrate base 46 in the thickness direction. Further, the lower portion of each of the protrusions on one side (protrusions 26a, 27a, 28a, and 29a on one side) is filled in the first base opening 48 and is in contact with the upper surface of the metal supporting board 11.

The second base opening 49 is formed partway in the second substrate base 47 in the widthwise direction so as to penetrate the second substrate base 47 in the thickness direction. Further, the lower portion of each of the protrusions on the other side (protrusions 26b, 27b, 28b, and 29b on the other side) is filled in the second base opening 49 and is in contact with the upper surface of the metal supporting board 11.

The positioning portion 35 is formed from the positioning base 37 including the first substrate base 46 and the second substrate base 47, and the widthwise other end surface of the widthwise other side with respect to the first base opening 48 in the first substrate base 46 and widthwise one end surface of widthwise one side with respect to the second base opening 49 in the second substrate base 47 are in contact with both the widthwise outer-side surfaces of the optical waveguide 20.

The conductive positioning portion 36 is spaced apart from the optical waveguide 20 in the widthwise direction.

Thus, when the positioning portion 35 is formed, each of the lower portions of the protrusions fills in the first base opening 48 and the second base opening 49, and is then in contact with the upper surface of the metal supporting board 11, so that the positioning portion 35 can be firmly fixed to the metal supporting board 11.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A method of producing a suspension board with circuit comprising the steps of:
    preparing a circuit board comprising preparing a metal supporting board, forming an insulating pattern on the metal supporting board, and forming a conductive pattern on the insulating pattern;
    preparing an optical waveguide;
    providing the circuit board with a positioning portion comprising a plurality of positioning protrusions for positioning the optical waveguide with the circuit board; and
    disposing the optical waveguide on the circuit board while positioning the optical waveguide with respect to the positioning portion,
    wherein the step of providing the circuit board with the positioning portion further comprises arranging the positioning protrusions to be on opposite sides of the optical waveguide so as to sandwich the optical waveguide therebetween in order to position the optical waveguide with respect to the circuit board when disposing the optical waveguide on the circuit board, and
    wherein, in the step of preparing the circuit board, the step of forming the conductive pattern on the insulating pattern is conducted simultaneously with the step of providing the positioning portion, such that the plurality of positioning protrusions are made from a conductive layer.

2. The method of producing a suspension board with circuit according to claim 1, wherein the step of providing the circuit board with the positioning portion further comprises arranging a plurality of pairs of the positioning protrusions at spaced intervals relative to each other over a direction in which the optical waveguide extends.

3. A method of producing a suspension board with circuit comprising the steps of:
    preparing a circuit board comprising preparing a metal supporting board, forming an insulating pattern on the metal supporting board, and forming a conductive pattern on the insulating pattern;
    preparing an optical waveguide;
    providing the circuit board with a positioning portion comprising a plurality of positioning protrusions for positioning the optical waveguide with the circuit board; and
    disposing the optical waveguide on the circuit board while positioning the optical waveguide with respect to the positioning portion,
    wherein the step of providing the circuit board with the positioning portion further comprises arranging the positioning protrusions to be on opposite sides of the optical waveguide so as to sandwich the optical waveguide therebetween in order to position the optical waveguide with respect to the circuit board when disposing the optical waveguide on the circuit board, and
    wherein, in the step of preparing the circuit board, the step of forming the insulating pattern on the metal supporting board is conducted simultaneously with the step of providing the positioning portion, such that the plurality of positioning protrusions are made from an insulating base layer.

4. The method of producing a suspension board with circuit according to claim 3, wherein the step of providing the circuit board with the positioning portion further comprises arranging a plurality of pairs of the positioning protrusions at spaced intervals relative to each other over a direction in which the optical waveguide extends.

* * * * *